(12) United States Patent
Rueb

(10) Patent No.: US 7,091,115 B2
(45) Date of Patent: Aug. 15, 2006

(54) METHOD FOR DOPING A SEMICONDUCTOR BODY

(75) Inventor: Michael Rueb, Faak am See (AT)

(73) Assignee: Infineon Technologies AG, Munich (DE)

( * ) Notice: Subject to any disclaimer, the term of this patent is extended or adjusted under 35 U.S.C. 154(b) by 181 days.

(21) Appl. No.: 10/745,933

(22) Filed: Dec. 23, 2003

(65) Prior Publication Data

US 2004/0185642 A1    Sep. 23, 2004

(30) Foreign Application Priority Data

Dec. 23, 2002  (DE) ............................ 102 60 644

(51) Int. Cl.
*H01L 21/425*   (2006.01)

(52) U.S. Cl. ...................... 438/530; 438/528
(58) Field of Classification Search ............ 438/528, 438/530
See application file for complete search history.

(56) References Cited

U.S. PATENT DOCUMENTS 4,522,657 A  *  6/1985  Rohatgi et al. ............... 438/57

FOREIGN PATENT DOCUMENTS

DE    10018371    10/2001
DE    10025567    12/2001

* cited by examiner

*Primary Examiner*—Howard Weiss
(74) *Attorney, Agent, or Firm*—Maginot, Moore & Beck

(57) ABSTRACT

The invention relates to a method for doping a semiconductor body (2), in which an n-type doping is introduced into the semiconductor body, which is initially p-doped, for example, by means of ion irradiation preferably with protons, which n-type doping is then cancelled by the action of a laser beam (8) in specific regions (9) so that the original p-type doping is present in said regions (9).

20 Claims, 2 Drawing Sheets

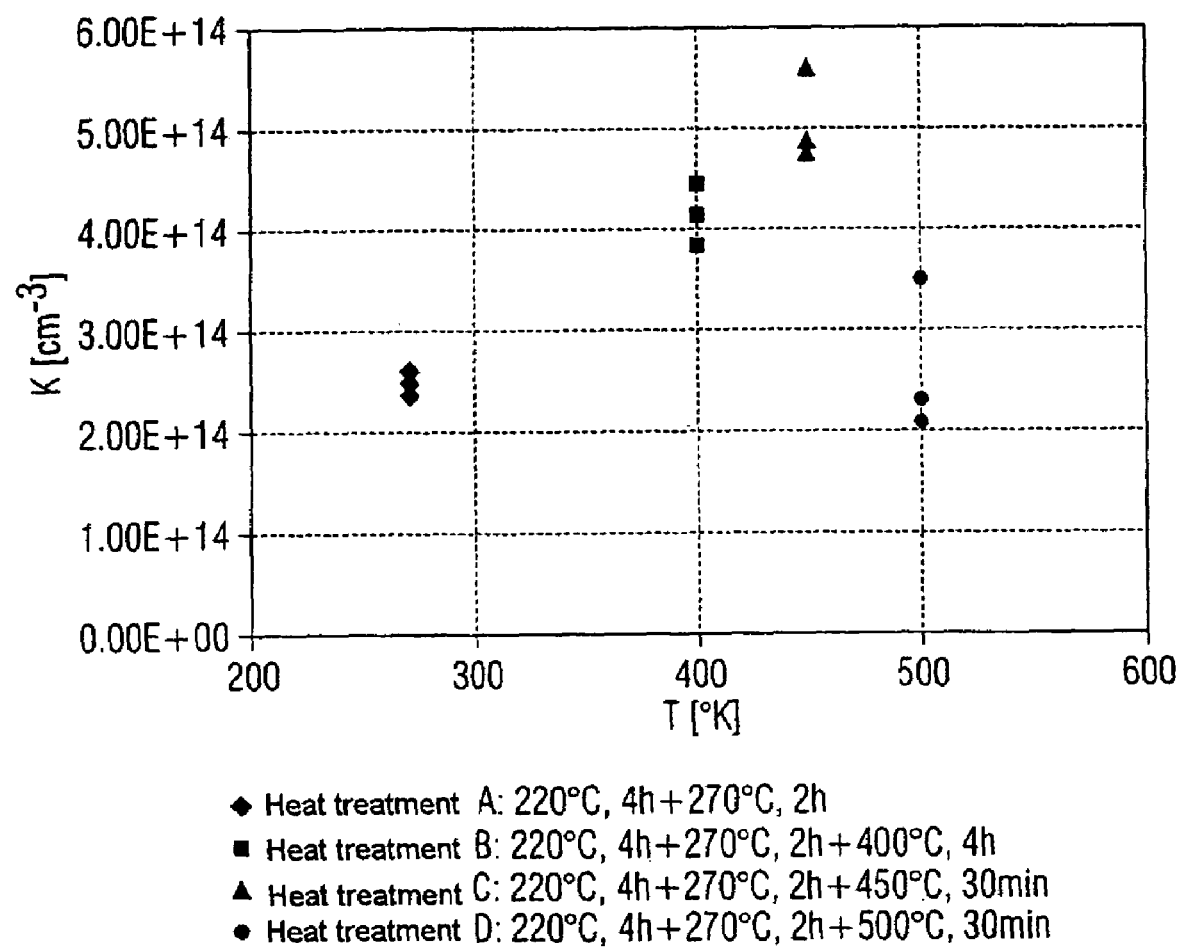

METHOD FOR DOPING A SEMICONDUCTOR BODY

FIELD OF THE INVENTION

The present invention relates to a method for doping a semiconductor body by implantation of ions which produce doping centers of the first conduction type in the semiconductor body, in which, after an ion irradiation, the semiconductor body is subjected to a first thermal treatment.

BACKGROUND

As is known, compensation components are high-voltage components with a dielectric strength of more than 300 V which are distinguished by an on resistance reduced by approximately one order of magnitude compared with conventional high-voltage components and are therefore extremely advantageous. In such compensation components, charge compensation is provided to the greatest possible extent in the drift zone thereof, so that, by way of example, p-conducting compensation regions are incorporated into the n-conducting drift zone of an n-channel transistor; the dopant quantities in said p-conducting compensation regions are set in such a way that there is charge compensation with the n-conducting surroundings of the drift zone.

In a vertical component, the compensation regions preferably comprise pillar-type zones located in the drift path in the region between the body zone and the drain zone.

In order to fabricate such a compensation component, at the present time use is preferably made of the so-called construction technique, which comprises a repeated succession of a process sequence with a masked low-energy implantation and the deposition of an epitaxial layer. The construction technique is complicated, this being attributable to said multiple succession of the process sequence.

In the case of the construction technique, by way of example, n-conducting epitaxial layers are deposited in order to fabricate an n-channel transistor, into which epitaxial layers, in each case after the deposition thereof, p-conducting compensation regions are introduced by ion implantation in such a way that they assume a pillar-type structure. Of course, it is also possible, however, to deposit a p-conducting epitaxial layer and to incorporate n-conducting compensation regions therein by means of implantation.

As is known, there are even further doping methods besides doping with the aid of epitaxy and ion implantation. One of these doping methods provides, in order to fabricate an n-type doping, a high-energy proton irradiation in silicon as semiconductor body. This is because during such a proton irradiation, intrinsic defect complexes which act as n-type dopants are produced in silicon. In this case, the proton irradiation has the advantage that the protons that are radiated in penetrate deeply into the silicon body even at relatively low energies. Thus, it shall be specified as an example that an implantation energy of 1.7 MeV leads to a penetration depth in silicon of about 36 μm.

Specifically, DE 100 25 567 A1 discloses a method for fabricating deeply doped n-conducting regions into a p-conducting semiconductor body, in which said n-conducting regions are produced by means of a masked implantation of protons and a subsequent heat treatment at temperatures of between 200 and 380° C. An indiffusion of hydrogen is performed at temperatures of between 400° C. and 500° C.

Furthermore, DE 100 18 371 A describes a method for fabricating a semiconductor substrate, in which a doping material is introduced into a semiconductor base material. In order to effect a spatially delimited change in the distribution of the doping material, locally delimited introduction of a quantity of heat in well-defined heating regions increases the temperature and consequently the rate of diffusion of the doping material from heating regions. The locally delimited introduction of a quantity of heat is preferably effected with the aid of a pulsed laser beam. This method is relatively complicated in terms of its practical implementation.

Maskings are necessary both for a direct implantation of, for example, high-energy boron for producing p-conducting regions and for producing an n-type doping by means of high-energy proton irradiation with a subsequent thermal step. So-called silicon stencil masks are appropriate as masks in this case since a conventional resist technique cannot be employed on account of the large thickness of the resist layer with 50 to 100 μm and the required accuracy. For a doping with high-energy protons, the application of stencil masks is problematic, however, since the high-energy implantation process for the proton doping can only be performed at the end of a complete wafer fabrication process, so that the stencil mask has to be aligned with the preceding photo-lithography planes. This alignment can only be realized with a high outlay on apparatus especially when the stencil mask has to be bonded to the wafer by means of a bonding technique.

When applying a proton irradiation to the fabrication of a compensation component, it would be conceivable to deposit p-doped epitaxial layers on an n-conducting wafer substrate and to produce the n-conducting regions—in the case of an n-channel transistor—in the drift path by a proton irradiation—masked by means of stencil masks—in the p-conducting epitaxial layers by counterdoping. The disadvantages associated with stencil masks cannot, therefore, be avoided here.

Therefore, it is an object of the present invention to specify a method for doping a semiconductor body which permits p- and n-conducting regions to be produced by means of proton irradiation without complicated masking in a semiconductor body.

SUMMARY

In the case of a method of the type mentioned in the introduction, this object is achieved according to the invention by virtue of the fact that the ion irradiation into a semiconductor body of the second conduction type is performed in such a way that the doping of the first conduction type prevails after the ion irradiation and the first thermal treatment in the semiconductor body, and wherein after the first thermal treatment, in specific regions in the semiconductor body a second thermal treatment is performed at a temperature which is higher than the temperature of the first thermal treatment and is so high that the n-type doping of the first conduction type produced by the ion irradiation after the first thermal treatment is at least weakened in the specific regions, so that the doping of the second conduction type prevails in said regions. Protons are preferably used as ions, and are radiated into a p-conducting silicon body doped with boron, for example. However, other ions can also be used provided that they produce a doping in a semiconductor body when they are radiated onto said semiconductor body. Besides silicon, it is also possible, by way of example, to choose silicon carbide, compound semiconductor, etc. as the semiconductor material.

The method according to the invention is especially suitable for fabricating compensation components. However, it may also be used in an advantageous manner whenever p/n-type structures are intended to be produced especially in deep regions of a semiconductor body. Thus, in its application, it is in no way restricted to compensation components.

In the method described in DE 100 18 371 A already mentioned, a local temperature swing is used to effect a change in the distribution of at least the doping material in a basic region. In contrast to a procedure of this type, the present invention does not strive to effect a redistribution of doping material, but rather to effect a destruction of doping complexes. This is a very crucial difference with respect to the prior art: whereas in the latter no dopant is lost and the volume integral over the doping remains unchanged in the entire semiconductor component, if an outdiffusion in the gas phase is disregarded, the method according to the invention strives precisely expressly to effect an irreversible destruction of dopant in which the n-type doping produced by the proton irradiation is at least weakened in regions so that the original p-doping prevails again in said regions. In other words, in the method according to the invention, the dopant balance in the semiconductor body of the component does not remain equalized, but rather is altered relative to the state before the second thermal treatment.

In an advantageous manner, the temperature during the second thermal treatment is set to be so high that the n-doping effected by the proton irradiation disappears in the specific regions, so that only the original p-doping is present in said regions.

For the second thermal treatment, a pulsed laser irradiation via a mask may expediently be brought to bear, so that a local heating occurs in those regions of the semiconductor body which are not covered by the mask. If silicon is used for the semiconductor body, then the threshold value for this heating is about 600° C. This is because above 600° C. there occurs resolution of the intrinsic defect complexes having a doping effect with protons or hydrogen. That is to say that the doping effect is lost, and the inherently overcompensated original p-doping can be manifested fully again as such.

The semiconductor body preferably comprises silicon. However, as has already been mentioned, it is possible, if appropriate to use another semiconductor material provided that a doping is produced in it by bombardment with ionizing radiation, which doping can be cancelled by means of a thermal treatment. It is assumed hereinafter, however, that protons are radiated onto p-conducting silicon.

The temperature during the first thermal treatment may be about 450° C. This is because at this temperature, as has been shown by experiments, a peak value is reached in the doping concentration of the n-type doping after a proton irradiation. However, temperatures above and below 450° C. are also possible for the first thermal treatment. A conceivable temperature range thus lies between 250 and 500° C., but a temperature range of between 400 and 500° C. is preferable.

If a temperature of more than 600° C. is chosen for the second thermal treatment, as has been explained above, then the temperature swing between the first and second thermal treatments is still only about 200° C. That is to say that a local heating of 200° C. suffices to cause the n-type doping produced by the proton irradiation to undergo resolution in the specific regions.

One essential advantage of the method according to the invention is that the high-energy implantation of the protons need not be masked. The laser irradiation which effects the patterning of the doping is carried out via a mask, advantageously a chromium mask, which can be aligned with the semiconductor body or wafer without any problems.

Furthermore, the method according to the invention may be conducted at relatively low temperatures in the region of somewhat above 600° C. in order that the n-type doping effected by the proton irradiation is eliminated during the second thermal treatment. In the case of conventional dopants such as, for example, boron, phosphorus or arsenic, temperatures in the region of about 1000° C. are required, by contrast, for outdiffusion.

With regard to the lateral resolution of p- and n-conducting regions, a sufficient accuracy is expected in the case of the method according to the invention since the temperature distribution at the edge of a heated local region should correspond to a Gaussian profile. As a result, the lateral accuracy is given by a convolution of the temperature distribution with the thermal stability curve of the n-doping complexes.

BRIEF DESCRIPTION OF THE DRAWINGS

The invention is explained in more detail below with reference to the drawings, in which:

FIG. 1 shows the profile of the peak concentration as a function of the temperature during a proton implantation with subsequent thermal treatment.

DETAILED DESCRIPTION

In FIG. 1, the peak doping concentration (charge carriers $cm^{-3}$) is plotted as a function of the absolute temperature (degrees K), for various heat treatments A to D. In this case, it can clearly be seen that a maximum doping concentration can be reached after a proton irradiation if an additional heat treatment at 450° C. for about 30 minutes is performed (cf. heat treatment C). Additional heat treatments at 400° C. for about 4 hours (cf. heat treatment B) and at 500° C. for about 30 minutes (cf. heat treatment D) produce significantly lower values of the peak doping concentration. In particular, FIG. 1 reveals that additional thermal treatments at 500° C. or above practically destroy the n-type doping achieved by the proton irradiation.

In the present invention, the stability curve—given by FIG. 1—of the n-doping complexes effected by the proton irradiation is utilized in that after the first thermal treatment performed after the irradiation, a further thermal treatment is employed at 600° C. or above. This further thermal treatment is carried out locally by the action of a laser beam in order to resolve the n-doping complexes in the chemical sense in specific regions, as is indicated by the measurement results of FIG. 1.

In other words, the method according to the invention for the first time utilizes, in a particularly advantageous manner, the "thermal behavior" of n-doping centers—produced by proton implantation—especially in silicon: a maximum of peak doping concentration is achieved with the first thermal treatment at approximately 450° C., while with the subsequent second temperature increase in regions, the temperature of which is approximately 200° C. above the temperature of the first temperature increase, the n-type doping is cancelled in the desired regions, so that the original p-type doping emerges again there.

Figure 4:
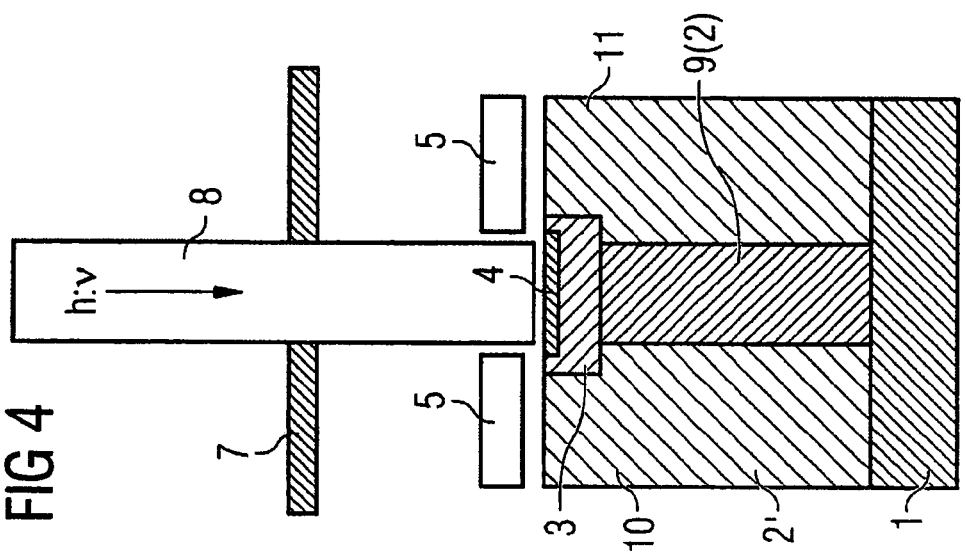
FIGS. 2–4 show sectional diagrams for elucidating the method according to the invention.
Figure 3:
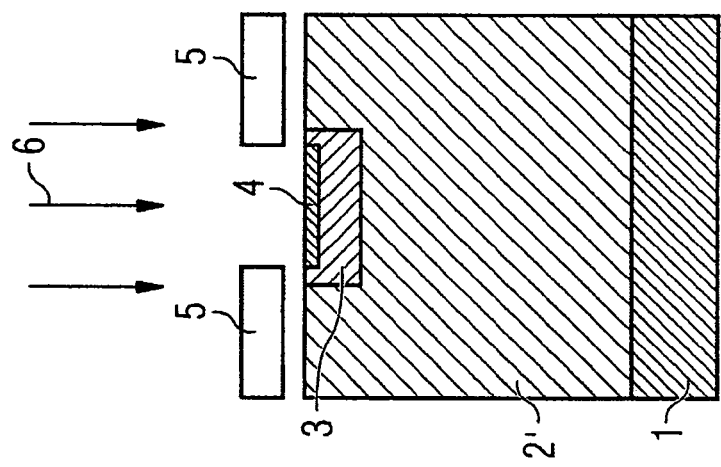
Figure 2:
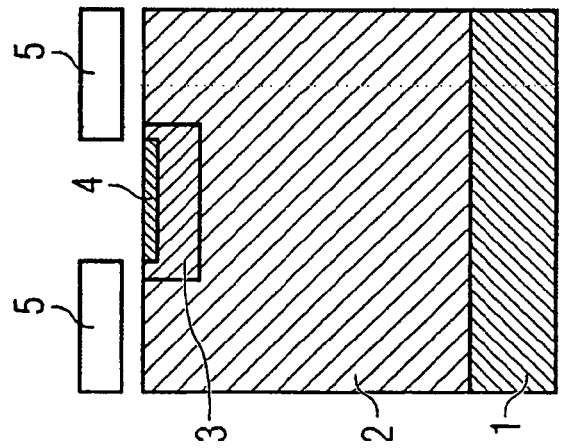

An exemplary embodiment of the method according to the invention is explained in more detail below with reference to FIGS. 2 to 4.

First of all, a p-doped epitaxial layer 2 is deposited onto a highly doped, n-conducting substrate wafer 1 in a customary manner. In this case, silicon is used in each case for the substrate wafer 1 and the epitaxial layer 2.

A MOS transistor with a p-doped body zone 3, an n-doped source zone 4 and a gate electrode 5 made of polycrystalline silicon is then fabricated in a customary manner in the surface region of the epitaxial layer 2. In this case, the gate electrode 5 may be embedded in an insulating layer and is aligned with the source zone 4. Boron may be used for the doping of the body zone 3, while phosphorus or arsenic are suitable dopants for the source zone 4. The structure shown in FIG. 2 is thus present.

There then follows a proton implantation, which is followed by a thermal treatment in a heat treatment process at about 450° C.

The proton implantation is performed with high energy and, if appropriate, a plurality of kinetic energy levels. This proton implantation is illustrated by arrows 6 in FIG. 3.

As a result of the high-energy proton implantation and a subsequent thermal treatment at about 450° C., the originally p-doped epitaxial layer 2 is converted into an n-doped epitaxial layer 2'. That is to say that the proton implantation is carried out with such a high dose that, in the epitaxial layer 2, the n-type net doping caused by the protons outweighs the original p-type net doping, so that overall the n-type net doping prevails in the epitaxial layer 2, thus yielding the n-doped epitaxial layer 2'.

No redoping takes place in this case in the body zone 3, since said body zone 3 is p-doped with a higher doping concentration than the epitaxial layer 2. The structure shown in FIG. 3 is thus obtained.

Finally, a laser beam 8 is brought to bear in regions with the aid of a chromium mask 7. Said laser beam 8 can, but need not, be aligned with the gate electrode 5, as is shown in FIG. 4. The action of this laser beam 8 cancels the n-type doping of the n-doped epitaxial layer 2' produced by the proton irradiation 6 and subsequent heat treatment, so that a p-doped region 9 is produced on account of the original p-type doping of the epitaxial layer 2, which region is thus located between two n-doped regions 10, 11 of the n-doped epitaxial layer 2'. The region 9 may be in pillar form in this case, so that the region 10, 11 encloses the region 9. Equally, other configurations of the region 9 are also possible, of course.

The laser beam 8 is set in such a way that the temperature rises above the threshold value of about 600° C. in the region 9 which results there in the resolution of the intrinsic defect complexes having an n-doping effect with hydrogen. That is to say that the doping effect is lost in said region 9, so that the previously overcompensated p-type doping of the epitaxial layer 2 can act again as such.

It goes without saying that it is readily possible to configure the chromium mask 7 in such a way that it has a plurality of openings, so that correspondingly a plurality of pillar-like or otherwise configured p-doped regions 9 can be produced simultaneously in the otherwise n-doped epitaxial layer 2'.

If the doping concentrations in the region 9 and in the regions 10, 11 are set to be approximately identical, then it is readily possible, given the same occupancy area of the region 9 on the one hand, and of the regions 10, 11 on the other hand, to produce charge compensation in the region between the body zone 3 and drain in the substrate wafer 1.

The method according to the invention is thus outstandingly suitable for producing compensation components since it permits, in a simple manner and without the use of complicated stencil masks, the production of patterned p-conducting regions in n-conducting surroundings and—given corresponding configuration of the chromium mask 7—also the production of a p-conducting grid around n-conducting pillars.

The method according to the invention can be carried out in gentle fashion since heat treatments are required only up to somewhat more than 600° C. for resolving the n-type doping produced by the proton irradiation. Disturbances to the component that has already been introduced (cf. FIG. 2) need not be feared as a result of this.

The invention claimed is:

1. A method for doping a semiconductor body to produce doping centers in the semiconductor body, the method comprising:
   a) performing ion irradiation on the semiconductor body of a second conduction type;
   b) after step a) subjecting the semiconductor body to a first thermal treatment at about 400° C. to 500° C. and sufficient to cause doping of the first conduction type to prevail,
   c) after step b) performing a second thermal treatment in at least one specific region in the semiconductor body, the second thermal treatment is performed at a temperature which is chosen to be at least about 200° C. higher than a temperature of the first thermal treatment and is sufficient to weaken the doping of the first conduction type resulting from steps a) and b) in the at least one specific region such that the doping of the second conduction type prevails in said at least one specific region.

2. The method as claimed in claim 1, wherein step c) further comprises performing the second thermal treatment at a temperature sufficient to substantially remove the doping of the first conduction type resulting from steps a) and b) in the at least one specific region.

3. The method as claimed in claim 1, wherein step c) further comprises performing the second thermal treatment using laser irradiation.

4. The method as claimed in claim 3, wherein step c) further comprises performing the second thermal treatment using laser irradiation and a mask.

5. The method as claimed in claim 3, wherein step c) further comprises performing the second thermal treatment using laser irradiation and a chromium mask.

6. The method as claimed in claim 1, wherein the first thermal treatment is performed at substantially 450° C.

7. The method as claimed in claim 1, wherein step c) further comprises performing the second thermal treatment in at least one pillar shaped specific region in the semiconductor body.

8. The method as claimed in claim 1, wherein step c) further comprises performing the second thermal treatment at a temperature sufficient to cause a doping concentration of the second conduction type in the at least one specific region to be substantially equal to a doping concentration of the first conduction type within the semiconductor body outside of the at least one specific region.

9. The method as claimed in claim 1, wherein step a) further comprises performing proton implantation.

10. A method for doping a semiconductor body to produce doping centers of the first conduction type in the semiconductor body, the method comprising:
    a) converting a conduction type of the semiconductor body from a second conduction type to a first conduction type using ion implantation and a first thermal treatment;

b) generating at least one specific region in the semiconductor body having the second conduction type using a second thermal treatment applied to the at least one specific region, the second thermal treatment having a temperature which is higher than a temperature of the first thermal treatment.

11. The method as claimed in claim 10, wherein step c) includes performing laser irradiation on the at least one specific region.

12. The method as claimed in claim 11, wherein step c) includes performing laser irradiation through a mask.

13. The method as claimed in claim 10, wherein the temperature of the second thermal treatment is chosen to be about 200° higher than the temperature of the first thermal treatment.

14. The method as claimed in claim 10, wherein the first thermal treatment is performed at about 400 to 500° C.

15. The method as claimed in claim 14, wherein the second thermal treatment is performed at a temperature of between 600 and 700° C.

16. The method as claimed in claim 10, wherein step b) further comprises performing the second thermal treatment at a temperature sufficient to substantially remove the doping of the first conduction type resulting from step a) in the at least one specific region.

17. The method as claimed in claim 16, wherein the first thermal treatment is performed at about 400 to 500° C.

18. The method as claimed in claim 17, wherein the second thermal treatment is performed at a temperature of more than 600° C.

19. The method as claimed in claim 10, wherein the second thermal treatment is performed at a temperature of more than 600° C.

20. The method as claimed in claim 10, wherein step b) further comprises performing the second thermal treatment at a temperature sufficient to cause a doping concentration of the second conduction type in the at least one specific region to be substantially equal to a doping concentration of the first conduction type within the semiconductor body outside of the at least one specific region.

* * * * *